(12) United States Patent
Petersen

(10) Patent No.: US 7,068,088 B2
(45) Date of Patent: Jun. 27, 2006

(54) SOFT-ERROR RATE IMPROVEMENT IN A LATCH

(75) Inventor: John T. Petersen, Fort Collins, CO (US)

(73) Assignee: Hewlett-Packard Development Company, L.P., Houson, TX (US)

( * ) Notice: Subject to any disclaimer, the term of this patent is extended or adjusted under 35 U.S.C. 154(b) by 30 days.

(21) Appl. No.: 10/976,034

(22) Filed: Oct. 27, 2004

(65) Prior Publication Data

US 2006/0087355 A1 Apr. 27, 2006

(51) Int. Cl.
*H03K 3/356* (2006.01)
(52) U.S. Cl. .................. 327/208; 327/210; 327/211
(58) Field of Classification Search ........ 327/199–203, 327/208, 210–212, 218, 206, 215, 219
See application file for complete search history.

(56) References Cited

U.S. PATENT DOCUMENTS

| | | | | | |
|---|---|---|---|---|---|
| 5,467,038 | A | * | 11/1995 | Motley et al. | 327/185 |
| 5,559,461 | A | * | 9/1996 | Yamashina et al. | 327/205 |
| 6,211,713 | B1 | * | 4/2001 | Uhlmann | 327/211 |
| 6,621,318 | B1 | * | 9/2003 | Burr | 327/218 |
| 2001/0028269 | A1 | * | 10/2001 | Shuler, Jr. | 327/277 |

* cited by examiner

*Primary Examiner*—Long Nguyen
*Assistant Examiner*—Ryan Jager

(57) ABSTRACT

In a preferred embodiment, the invention provides a circuit and method for reducing soft error events in latches. The input of a first inverter is connected to the output of a second inverter. The input of a second inverter is connected to the output of the first inverter. When the input to the first inverter is disturbed by a soft error event, a signal tristates the first inverter.

2 Claims, 4 Drawing Sheets

SOFT-ERROR RATE IMPROVEMENT IN A LATCH

FIELD OF THE INVENTION

This invention relates generally to latch design. More particularly, this invention relates to improving soft error immunity in latches.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terms of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100–800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly.

At the circuit level, SER may be reduced by increasing the ratio of capacitance created by oxides to the capacitance created by p/n junctions. The capacitance in a latch, among other types, includes capacitance created by p/n junctions and capacitance created by oxides. Since electron/hole pairs are created as high-energy neutrons pass through a p/n junction, a reduction in the area of p/n junctions in a latch typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in latches. An embodiment of this invention reduces the SER in latches while adding as few as two additional transistors.

SUMMARY OF THE INVENTION

In a preferred embodiment, the invention provides a circuit and method for reducing soft error events in latches. The input of a first inverter is connected to the output of a second inverter. The input of a second inverter is connected to the output of the first inverter. When the input to the first inverter is disturbed by a soft error event, a signal tristates the first inverter.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
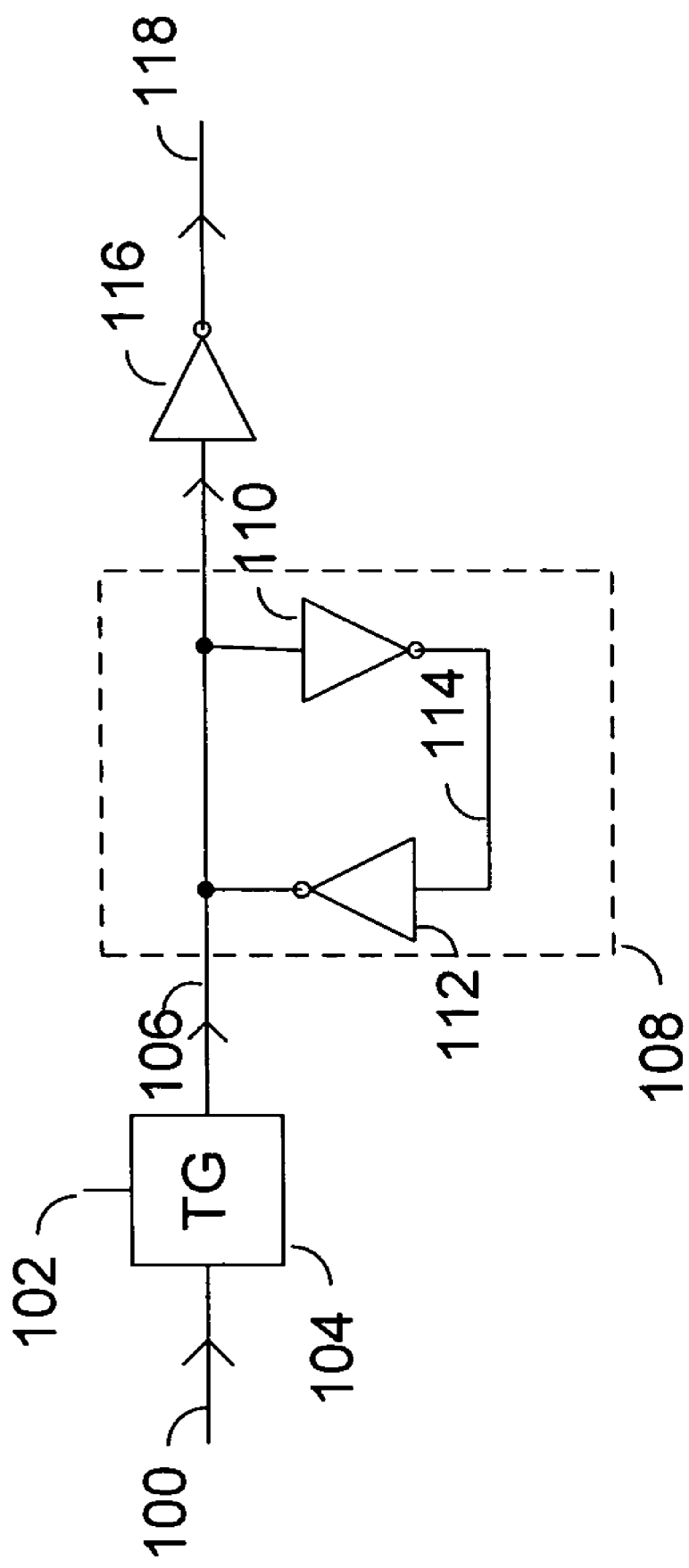
FIG. 1 is a schematic diagram of a transfer gate, a latch, and an inverter. Prior Art

FIG. 1 is a schematic diagram of a transfer gate, a latch, and an inverter. An input, 100, is connected to the input of transfer gate, 104. The output, 106, of the transfer gate, 104, is connected to the input/output of the latch, 108. Control signal, 102, controls when the signal on the input, 100, of the transfer gate, 104, is transferred to the output, 106, of the transfer gate, 104. The signal presented at the output, 106, is stored on the latch, 108. The signal, 106, stored on the latch, 108, drives the input, 106, of the inverter, 116. In this example, the output, 118, of the inverter, 116, has the opposite sense of the signal stored on the latch, 108. In this example, a latch comprises two inverters, 110 and 112, where the output, 114, of one inverter, 110, is connected to input, 114, of another inverter, 112 and the output, 106, of one inverter, 112, is connected to the input, 106, of another inverter, 110.

After control signal, 102, is turned off, the signal, 106 on the latch, 108, is usually retained. If, however, a soft error event disturbs the charge stored on the latch, the original signal may be lost and the output, 118, of inverter, 116, may be changed from its original logical value.

Figure 2:
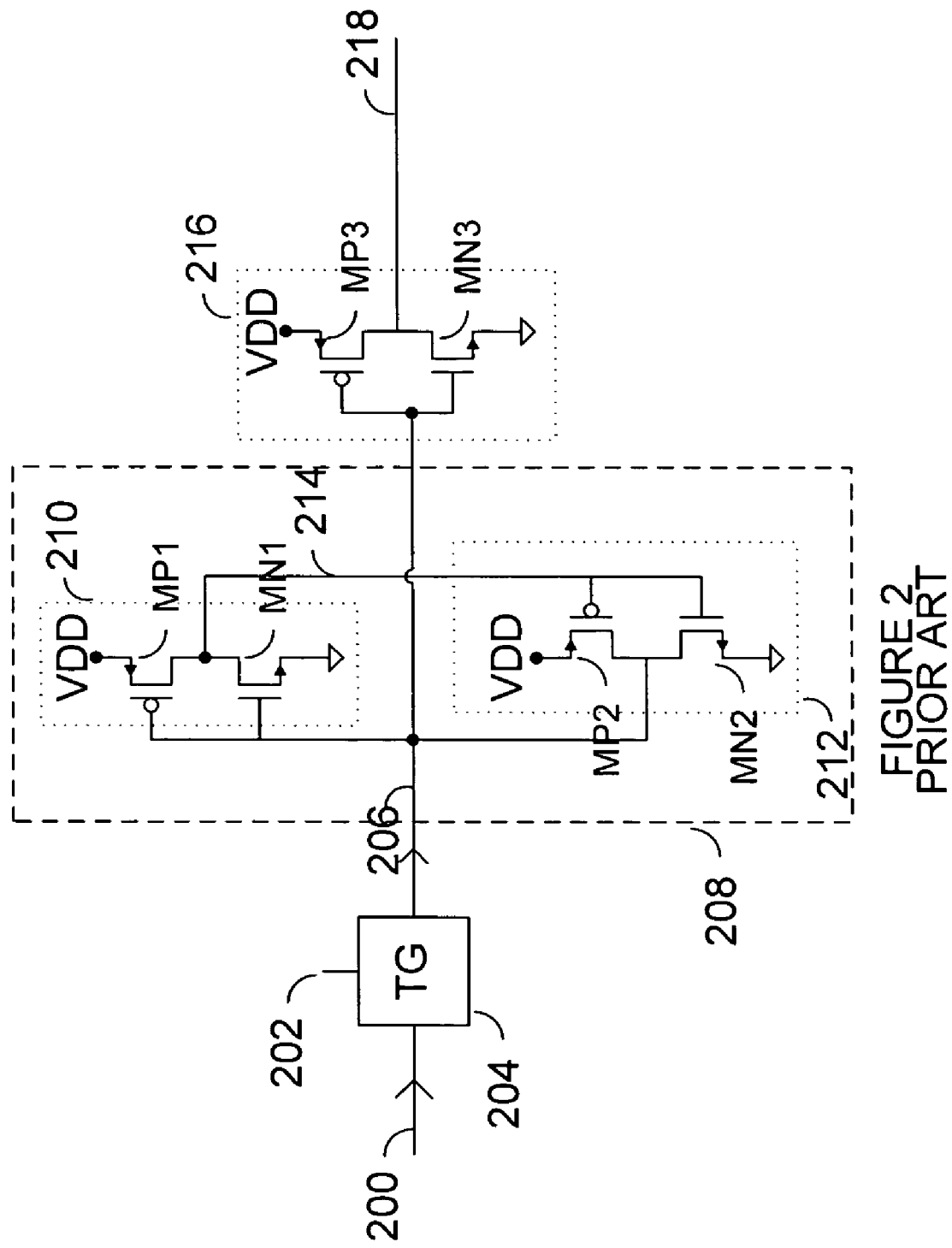
FIG. 2 is a schematic diagram of a transfer gate, a latch, and an inverter. Prior Art

FIG. 2 is a schematic diagram of a transfer gate, a latch, and an inverter. An input, 200, is connected to the input of transfer gate, 204. The output, 206, of the transfer gate, 204, is connected to the input/output of the latch, 208. Control signal, 202, controls when the signal on the input, 200, of the transfer gate, 204, is transferred to the output, 206, of the transfer gate, 204. The signal presented at the output, 206, is stored on the latch, 208. The signal, 206, stored on the latch, 208, drives the input, 206, of the inverter, 216. In this example, the output, 218, of the inverter, 216, has the opposite sense of the signal stored on the latch, 208.

In this example, a latch, 208, comprises two inverters, 210 and 212, where the output, 214, of one inverter, 210, is connected to input, 214, of another inverter, 212 and the output, 206, of one inverter, 212, is connected to the input, 206, of another inverter, 210. In this example, inverter 210 comprises a PFET, MP1, and an NFET, MN1. The gates, 206, of PFET, MP1, and NFET, MN1, are connected. The source of PFET, MP1, is connected to VDD and the source of NFET, MN1, is connected to GND. The drains of PFET, MP1, and NFET, MN1, are connected at node 214. In this example, inverter 212 comprises a PFET, MP2, and an NFET, MN2. The gates, 214, of PFET, MP2, and NFET, MN2, are connected. The source of PFET, MP2, is connected to VDD and the source of NFET, MN2, is connected to GND. The drains of PFET, MP2, and NFET, MN2, are connected at node 206. Inverter 216 comprises a PFET, MP3, and an NFET, MN3. The gates of PFET, MP3, and NFET, MN3, are connected at node 206. The source of PFET, MP3, is connected to VDD. The source of NFET, MN3, is connected to ground. The drains of PFET, MP3, and NFET, MN3, are connected at node 218. In this example, inverters, 210, 212, and 216 were implemented using PFETs and NFETs. Other implementations of an inverter may be used.

After control signal, 202, is turned off, the signal, 206 on the latch, 208, is usually retained. If, however, a soft error event disturbs the charge stored on the latch, the original signal may be lost and the output, 218, of inverter, 216, may be changed from its original logical value.

Figure 3:
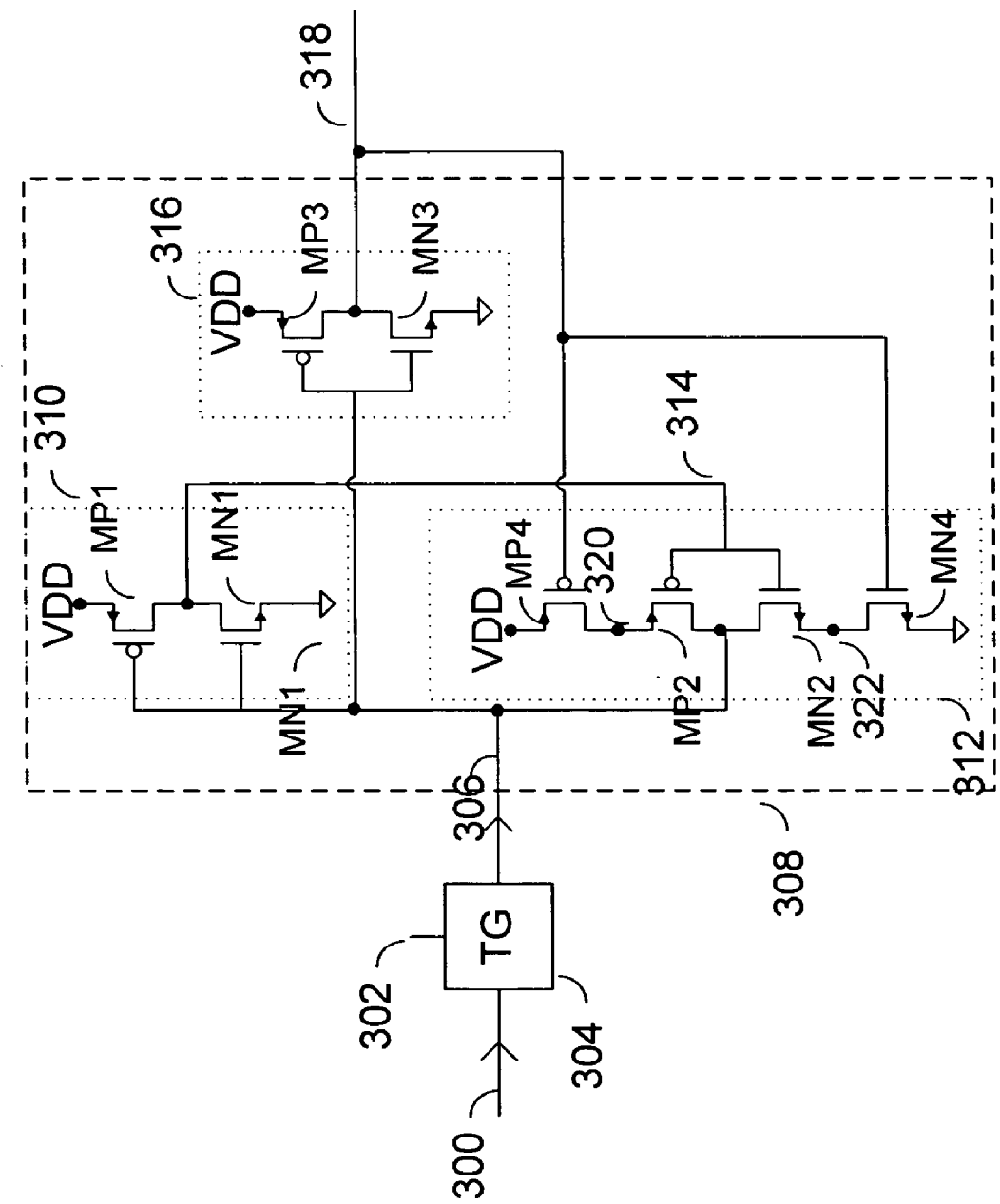
FIG. 3 is a schematic diagram of a transfer gate, a tristatable latch, and an inverter.

FIG. 3 is a schematic diagram of a transfer gate, a tristatable latch, and an inverter. An input, 300, is connected to the input of transfer gate, 304. The output, 306, of the transfer gate, 304, is connected to the input/output of the tristatable latch, 308. Control signal, 302, controls when the signal on the input, 300, of the transfer gate, 304, is transferred to the output, 306, of the transfer gate, 304. The signal presented at the output, 306, is stored on the tristatable latch, 308. The signal, 306, stored on the tristatable latch, 308, drives the input, 306, of the inverter, 316. In this example, the output, 318, of the inverter, 316, has the opposite sense of the signal stored on the tristatable latch, 308. In this example, a tristatable latch comprises an inverter, 310 and a tristatable inverter, 312, where the output, 314, of the inverter, 310, is connected to the first input, 314, of the tristatable inverter, 312 and the output, 306, of the tristatable inverter, 312, is connected to the input, 306, of the first inverter, 310.

In this example, inverter 310 comprises a PFET, MP1, and an NFET, MN1. The gates, 306, of PFET, MP1, and NFET, MN1, are connected. The source of PFET, MP1, is connected to VDD and the source of NFET, MN1, is connected to GND. The drains of PFET, MP1, and NFET, MN1, are connected at node 314. In this example, the tristatable inverter 312 comprises a PFET, MP2, a PFET, MP4, an NFET, MN4 and an NFET, MN2. The gates, 314, of PFET, MP2, and NFET, MN2, are connected. The gates, 318, of PFET, MP4, and NFET, MN4, are connected. The source of PFET, MP4, is connected to VDD and the source of NFET, MN4, is connected to GND. The drain of PFET, MP4, and the source of PFET, MP2, is connected at node 320. The drain of PFET, MP2, and the drain of NFET, MN2, is connected at node 306. The source of NFET, MN2, and the drain of NFET, MN4, is connected at node 322. Inverter 316 comprises a PFET, MP3, and an NFET, MN3. The gates of PFET, MP3, and NFET, MN3, are connected at node 306. The source of PFET, MP3, is connected to VDD. The source of NFET, MN3, is connected to ground. The drains of PFET, MP3, and NFET, MN3, are connected at node 318. In this example, inverter, 310, tristatable inverter, 312, and inverter, 316 were implemented using PFETs and NFETs. Other implementations of an inverter or tristatable inverter may be used.

After control signal, 302, is turned off, the signal, 306 on the tristatable latch, 308, is usually retained. If, however, a soft error event disturbs the charge stored on node 306, the original signal may be lost and the output, 318, of inverter, 316, may be changed from its original logical value. However, if a soft error event disturbs the charge stored on node 314, the original logic on 306 and node 318 will not change because the tristatable inverter, 312, tristates.

For example, if the tristatable latch, 308, has a logical one stored on it and transfer gate, 304, is off, node 306 is a logical high value, node 318 is a logical low value, and node 314 is a logical low value. In this example, if a soft error event disturbs node 314 from a logical low value to a logical high value, node 306 will remain a logical high value and node 318 will remain a logical low value because PFET, MP2, is off and NFET, MN4 is off, tristating tristatable inverter, 312. Because tristatable inverter, 312, is tristated, node 306 retains its original high value and node 318 retains its low value. Because node 306 is a logical high value, node 314, is changed back to its original low logical value. Since node 314 is recovered to its original low logical value, tristatable inverter, 312, is no longer tristated; instead tristatable inverter, 312, actively drives node 306 to a high logical value.

Another example is, if the tristatable latch, 308, has a logical zero stored on it and transfer gate, 304, is off, node 306 is a logical low value, node 318 is a logical high value, and node 314 is a logical high value. In this example, if a soft error event disturbs node 314 from a logical high value to a logical low value, node 306 will remain a logical low value and node 318 will remain a logical high value because PFET, MP4, is off and NFET, MN2 is off, tristating tristatable inverter, 312. Because tristatable inverter, 312, is tristated, node 306 retains its original low value and node 318 retains its high logical value. Because node 306 is a logical low value, node 314, is changed back to its original high logical value. Since node 314 is recovered to its original high logical value, tristatable inverter, 312, is no longer tristated; instead tristatable inverter, 312, actively drives node 306 to a low logical value.

Figure 4:
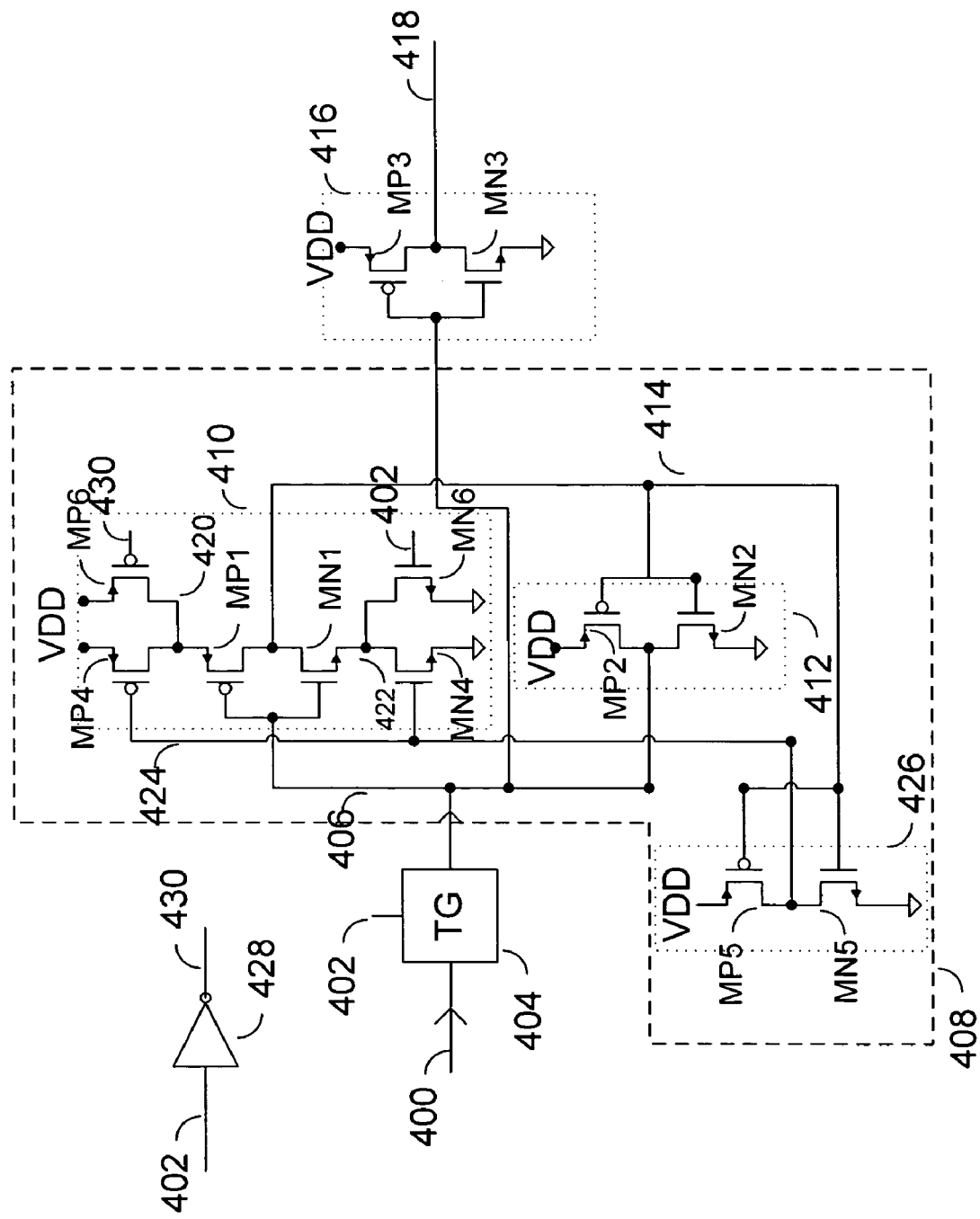
FIG. 4 is a schematic diagram of a transfer gate, a tristatable latch, a first inverter, and a second inverter.

FIG. 4 is a schematic diagram of a transfer gate, a tristatable latch, a first inverter, and a second inverter. An input, 400, is connected to the input of transfer gate, 404. The output, 406, of the transfer gate, 404, is connected to the input/output, 406 of the tristatable latch, 408. Control signal, 402, controls when the signal on the input, 400, of the transfer gate, 404, is transferred to the output, 406, of the transfer gate, 404. The signal presented at the output, 406, is stored on the tristatable latch, 408. The signal, 406, stored on the tristatable latch, 408, drives the input, 406, of the inverter, 416. In this example, the output, 418, of the inverter, 416, has the opposite sense of the signal stored on the tristatable latch, 408.

In this example, a tristatable latch, 408, comprises an inverter, 412, an inverter, 426, and a tristatable inverter, 410, where the output, 414, of the tristatable inverter, 410, is connected to input, 414, of the inverter, 412 and to the input, 412, of the inverter, 426. The output, 406, of inverter 412, is connected to an input, 406, of the tristatable inverter. The output, 424, of inverter 426, is connected to an input, 424, of the tristatable inverter. Control signal, 402, is connected to an input, 402, of the tristatable inverter and to the input of inverter 428. The output, 430, of inverter, 428, is connected to an input of the tristatable inverter. In this example, inverter 412 comprises a PFET, MP2, and an NFET, MN2. The gates, 414, of PFET, MP2, and NFET, MN2, are connected. The source of PFET, MP2, is connected to VDD and the source of NFET, MN2, is connected to GND. The drains of PFET, MP2, and NFET, MN2, are connected at node 406. In this example, inverter 426 comprises a PFET, MP5, and an NFET, MN5. The gates, 414, of PFET, MP5, and NFET, MN5, are connected. The source of PFET, MP5, is connected to VDD and the source of NFET, MN5, is connected to GND. The drains of PFET, MP5, and NFET, MN5, are connected at node 424. In this example, the tristatable inverter 410 comprises a PFET, MP1, a PFET, MP4, a PFET, MP6, an NFET, MN4, an NFET, MN6, and an NFET, MN1. The gates, 406, of PFET, MP1, and NFET, MN1, are connected. The gates, 424, of PFET, MP4, and NFET, MN4, are connected. The gate, 402, of NFET, MN6, is connected to control signal 402. The gate, 430, of PFET, MP6, is connected to the output, 430, of inverter 428. The source of PFET, MP4, and the source of PFET, MP6, is connected to VDD. The source of NFET, MN4, and the source of NFET, MN6, is connected to GND. The drain of PFET, MP4, the drain of PFET, MP6, and the source of PFET, MP1, is connected at node 420. The drain of PFET, MP1, and the drain of NFET, MN1, is connected at node 414. The source of NFET, MN1, the drain of MN6, and the drain of NFET, MN4, is connected at node 422. Inverter 416 comprises a PFET, MP3, and an NFET, MN3. The gates of PFET, MP3, and NFET, MN3, are connected at node 406. The source of PFET, MP3, is connected to VDD. The source of NFET, MN3, is connected to ground. The drains of PFET, MP3, and NFET, MN3, are connected at node 418. In this example, inverter, 412, tristatable inverter, 410, inverter, 426, and inverter, 416 were implemented using PFETs and NFETs. Other implementations of an inverter or tristatable inverter may be used.

After control signal, 402, is turned off, the signal, 406 on the tristatable latch, 408, is usually retained. If, however, a soft error event disturbs the charge stored on node 414, the original signal may be lost and the output, 418, of inverter, 416, may be changed from its original logical value. However, if a soft error event disturbs the charge stored on node 406, the original logic value on node 414 will not change because the tristatable inverter, 410, tristates.

For example, if the tristatable latch, 408, has a logical one stored on it and transfer gate, 404, is off, node 406 is a logical high value, node 418 is a logical low value, and node 414 is a logical low value. Also, since transfer gate, 404, is off, node 402 is low and node 430 is high. In this example, if a soft error event disturbs node 406 from a logical high value to a logical low value, node 414 will remain a logical low value because PFET, MP4, PFET, MN6, NFET, MN6 and NFET, MN1 are off, tristating tristatable inverter, 410. Node 418 will temporarily change from a logical low value to a logical high value. Because tristatable inverter, 410, is tristated, node 414 retains its original low value. Because node 414 is a logical low value, node 406, is changed back to its original high logical value. Since node 406 is recovered to its original high logical value, node 418 is recovered to its original low logical value. Since node 406 is recovered to its original high logical value, tristatable inverter, 410, is no longer tristated, instead tristatable inverter, 410, actively drives node 414 to a low logical value.

Another example is, if the tristatable latch, 408, has a logical zero stored on it and transfer gate, 404, is off, node 406 is a logical low value, node 418 is a logical high value, and node 414 is a logical high value. Also, since transfer gate, 404, is off, node 402 is low and node 430 is high. In this example, if a soft error event disturbs node 406 from a logical low value to a logical high value, node 414 will remain a logical high value because PFET, MP1, PFET, MP6, NFET, MN6, and NFET, MN4 are off, tristating tristatable inverter, 410. Node 418 will temporarily change from a logical high value to a logical low value. Because tristatable inverter, 410, is tristated, node 414 retains its original high value. Because node 414 is a logical high value, node 406, is changed back to its original low logical value. Since node 406 is recovered to its original low logical value, node 418 is recovered to its original high logical value. Since node 406 is recovered to its original high logical value, tristatable inverter, 410, is no longer tristated; instead tristatable inverter, 410, actively drives node 414 to a high logical value.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A tristatable latch for reducing soft errors comprising:
    a) a tristatable inverter, the tristatable inverter having a first input, a second input, a third input, a fourth input, and an output;
    b) a first inverter, the first inverter having an input and an output;
    c) a second inverter, the second inverter having an input and an output;
    d) wherein the first input of the tristatable inverter is connected to the output of the first inverter;
    e) wherein the input of the first inverter is connected to the output of the tristatable inverter;
    f) wherein the input of the second inverter is connected to the input of the first inverter;
    g) wherein the output of the second inverter is connected to the second input of the tristatable inverter;
    h) wherein the third input of the tristatable inverter is connected to a clock signal;
    i) wherein the fourth input of the tristatable inverter is connected to an opposite phase of the clock signal;
    j) wherein the tristatable inverter is tristated when the first input to the tristatable inverter is disturbed by a soft error event;
    k) wherein the tristatable inverter further comprises:
        k.1) a first PFET, the first PFET having a gate, drain and source;
        k.2) a second PFET, the second PFET having a gate, drain and source;
        k.3) a third PFET, the third PFET having a gate, drain, and source;
        k.4) a first NFET, the first NFET having a gate, drain and source;
        k.5) a second NFET, the second NFET having a gate, drain and source;
        k.6) a third NFET, the third NFET having a gate, drain, and source;
        k.7) wherein the source of the first PFET is connected to VDD;
        k.8) wherein the source of the third PFET is connected to VDD;

k.9) wherein the source of the second NFET is connected to GND;
k.10) wherein the source of the third NFET is connected to GND;
k.11) wherein the drain of the first PFET and the drain of the third PFET are connected to the source of the second PFET;
k.12) wherein the drain of the second PFET and the drain of the first NFET are connected to the output of the tristatable inverter;
k.13) wherein the source of the first NFET is connected to the drain of the second NFET and the drain of the third NFET;
k.14) wherein the gate of second PFET and the gate of the first NFET are connected to the first input of the tristatable inverter;
k.15) wherein the gate of the first PFET and the gate of the second NFET are connected to the second input of the tristatable inverter;
k.16) wherein the gate of the third NFET is connected to the third input of the tristatable inverter;
k.17) wherein the gate of the third PFET is connected to the fourth input of the tristatable inverter.

2. A method for manufacturing a tristatable latch for reducing soft errors comprising:
a) fabricating a tristatable inverter, the tristatable inverter having a first input, a second input, a third input, a fourth input, and an output;
b) fabricating a first inverter, the first inverter having an input and an output;
c) fabricating a second inverter, the second inverter having an input and an output;
d) wherein the first input of the tristatable inverter is connected to the output of the first inverter;
e) wherein the input of the first inverter is connected to the output of the tristatable inverter;
f) wherein the input of the second inverter is connected to the input of the first inverter;
g) wherein the output of the second inverter is connected to the second input of the tristatable inverter;
h) wherein the third input of the tristatable inverter is connected to a clock signal;
i) wherein the fourth input of the tristatable inverter is connected to an opposite phase of the clock signal;
j) wherein the tristatable inverter is tristated when the first input to the tristatable inverter is disturbed by a soft error event;
k) wherein the tristatable inverter further comprises:
k.1) a first PFET, the first PFET having a gate, drain and source;
k.2) a second PFET, the second PFET having a gate, drain and source;
k.3) a third PFET, the third PFET having a gate, drain, and source;
k.4) a first NFET, the first NFET having a gate, drain and source;
k.5) a second NFET, the second NFET having a gate, drain and source;
k.6) a third NFET, the third NFET having a gate, drain, and source;
k.7) wherein the source of the first PFET is connected to VDD;
k.8) wherein the source of the third PFET is connected to VDD;
k.9) wherein the source of the second NFET is connected to GND;
k.10) wherein the source of the third NFET is connected to GND;
k.11) wherein the drain of the first PFET and the drain of the third PFET are connected to the source of the second PFET;
k.12) wherein the drain of the second PFET and the drain of the first NFET are connected to the output of the tristatable inverter;
k.13) wherein the source of the first NFET is connected to the drain of the second NFET and the drain of the third NFET;
k.14) wherein the gate of second PFET and the gate of the first NFET are connected to the first input of the tristatable inverter;
k.15) wherein the gate of the first PFET and the gate of the second NFET are connected to the second input of the tristatable inverter;
k.16) wherein the gate of the third NFET is connected to the third input of the tristatable inverter;
k.17) wherein the gate of the third PFET is connected to the fourth input of the tristatable inverter.

* * * * *